United States Patent
Katoh et al.

(10) Patent No.: US 6,940,323 B2
(45) Date of Patent: Sep. 6, 2005

(54) PHASE LOCKED LOOP CIRCUIT WITH AN UNLOCK DETECTION CIRCUIT AND A SWITCH

(75) Inventors: Teruo Katoh, Tokyo (JP); Takaaki Akiyama, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 51 days.

(21) Appl. No.: 10/670,516

(22) Filed: Sep. 26, 2003

(65) Prior Publication Data

US 2004/0061536 A1 Apr. 1, 2004

(30) Foreign Application Priority Data

Sep. 27, 2002 (JP) ........................ 2002-282962

(51) Int. Cl.[7] ............................................. H03L 7/06
(52) U.S. Cl. .................................. 327/156; 327/147
(58) Field of Search .............................. 327/146, 147, 327/154, 156, 162, 163; 331/17, 25, DIG. 2; 375/373, 375, 376

(56) References Cited

U.S. PATENT DOCUMENTS

| | | | |
|---|---|---|---|
| 4,105,975 A | * | 8/1978 | Sanders et al. ............. 375/346 |
| 5,528,372 A | | 6/1996 | Kawashima ................ 356/401 |
| 5,686,864 A | * | 11/1997 | Martin et al. .............. 331/1 A |
| 6,670,632 B1 | | 12/2003 | Fujimoto .................... 257/48 |

FOREIGN PATENT DOCUMENTS

| | | |
|---|---|---|
| JP | 62-114330 | 5/1987 |
| JP | 1-291524 | 11/1989 |
| JP | 4-273618 | 9/1992 |
| JP | 7-86931 | 3/1995 |
| JP | 9-153797 | 6/1997 |

* cited by examiner

*Primary Examiner*—Linh My Nguyen
(74) *Attorney, Agent, or Firm*—Wenderoth, Lind & Ponack, L.L.P.

(57) ABSTRACT

A phase locked loop circuit includes a phase comparator, a loop filter, a controlled oscillator, a limiter, a frequency divider, an unlock detecting circuit and a switch. The phase comparator compares an index signal and a reference signal. The loop filter smoothes an output signal of the phase comparator. The controlled oscillator oscillates at a frequency in accordance with an output signal of the loop filter. The limiter connected between an output of the phase comparator and an input of the controlled oscillator. The limiter limits the level of a signal passing therethrough at a predetermined range. The frequency divider divides an output signal of the controlled oscillator and generates the reference signal. The unlock detecting circuit outputs the unlocking of a phase lock based on the index signal and the reference signal. The switch shuts up an output signal of the loop filter based on an unlock detecting signal.

5 Claims, 12 Drawing Sheets

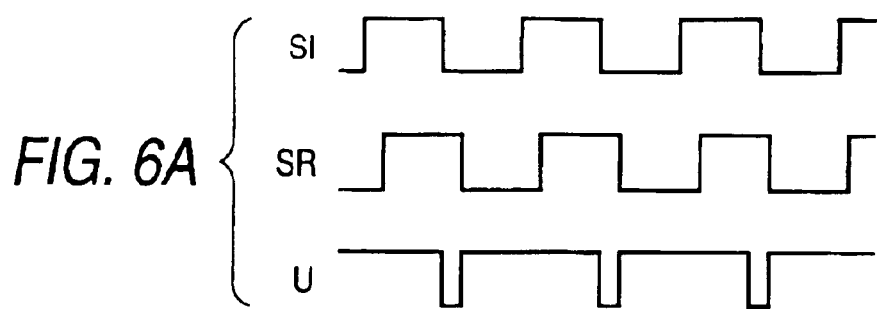
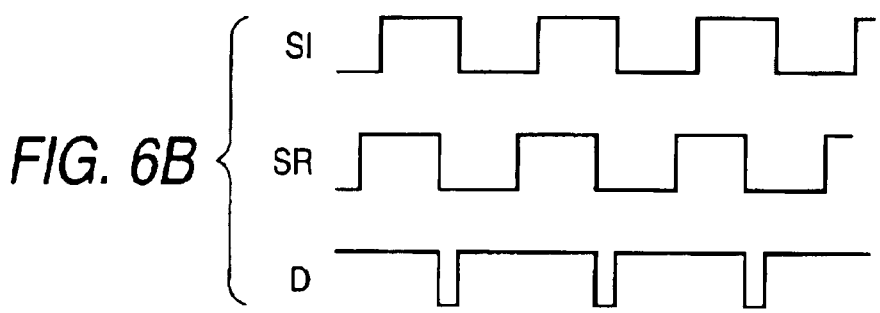
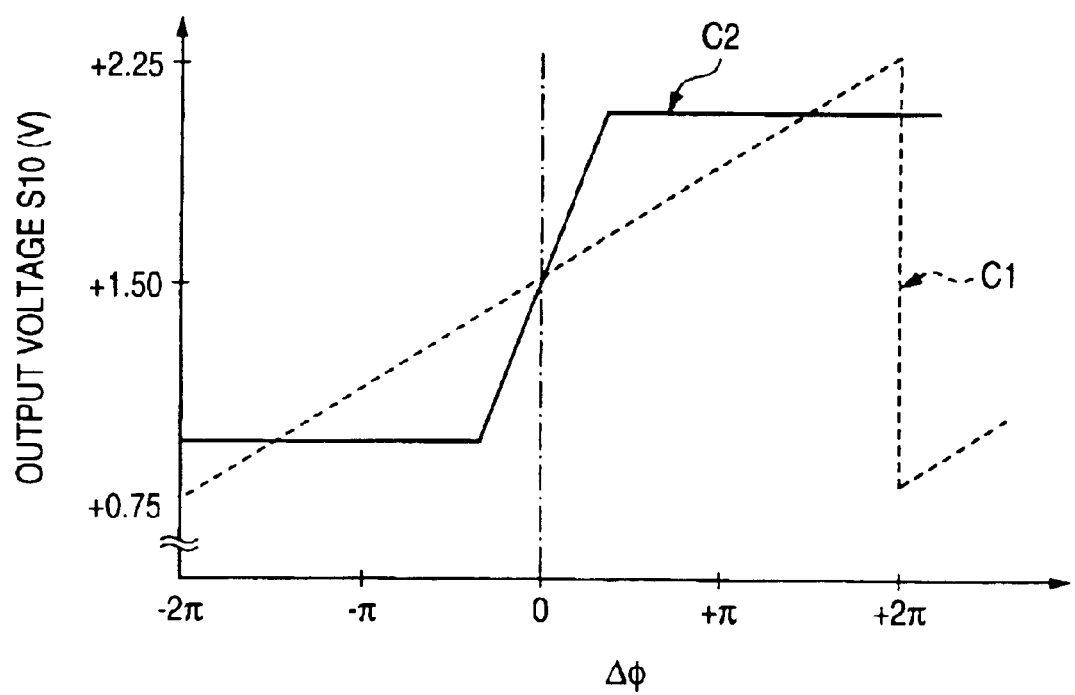

PHASE LOCKED LOOP CIRCUIT WITH AN UNLOCK DETECTION CIRCUIT AND A SWITCH

BACKGROUND OF THE INVENTION

The present invention relates to a phase-locked loop (called PLL, hereinafter) circuit to be used for a frequency multiplier (that is, frequency synthesizer) or the like, for generating signals synchronized with input signals in phase and in particular to the improvement in a phase-locked lead-in circuit.

Conventional technologies rating to a PLL circuit are disclosed in JP-A-9-153797 (especially in FIGS. 1 and 4) and Howard M. Berlin, Keiichi Miyata and Fumi Tokuhushi, "PLL no Sekkei to Jitsuyou kairo (Design of PLL and Practical circuits)", SeaStar, Apr. 1, 1992, especially in pgs. 1–3, 19–31, 49–50, 59–70 and 91.

Conventionally, as shown in FIG. 4 in JP-A-9-153797, a PLL circuit to be used in a frequency multiplier includes a phase comparator, a loop filter, a voltage controlled oscillator (called "VCO" hereinafter) and a frequency divider. The phase comparator compares phases of the index signal of a frequency fi and the reference signal of a frequency fr and generates the average output voltage (which is a direct current (DC) output voltage also called error voltage) in proportion to the phase difference $\Delta\phi$ (=fi–fr). The loop filter includes a low-pass filter (called "LPF" hereinafter) for smoothing the output voltage of the phase comparator. The VCO oscillates at a frequency f0 in accordance with the output voltage of the loop filter. The frequency divider divides the output signals of the VCO by a predetermined frequency-dividing rate N (where N is a positive integer), generates the reference signal and feedback-inputs the reference signal to the phase comparator.

In this kind of PLL circuit, the oscillation frequency f0 of the VCO is divided by the frequency-divider and becomes the reference signal of the frequency fr. The reference signal of the frequency fr is returned to the phase comparator, and is compared with the frequency fi of the index signal by the phase comparator. Then, an error voltage is output. The error voltage is an average direct current voltage in proportion to the frequency difference (fi–fr) and the phase difference $\Delta\phi$ of the index signal and reference signal. An influence of high-frequency noise is eliminated from the error voltage by the loop filter, and the result is returned to the VCO. Thus, the frequency f0 of the VCO varies so as to obtain lower frequency differences (fi–fr), and the loop enters a capture range state.

This processing is repeated until the frequency fr of the reference signal agrees with the frequency fi of the index signal and until the frequency difference (fi–fr) reaches zero. When the frequency fr and frequency fi agree, the loops are synchronized (that is, a phase-locked state). In the phase-locked state, the frequency f0 of the VCO is proportional to the frequency fi of the input index signal except for some finite phase differences. The phase difference is required for generating an error voltage required for shifting the frequency of the VCO so as to maintain the loops in the phase-locked state. Because of the repeated operation of the loop system in the phase-locked state, the output signal with N times of frequency rate in phase with the index signal in accordance with any changes in the index signal is output from an output terminal of the VCO.

As disclosed in "Design of PLL circuit and Practical circuit (pgs. 1 to 3), an entire range in which the loop system follows the change in frequency fi of the index signal is called a lock range. The lock range is wider than a frequency range (that is, capture range) in which the loops are in the phase-locked state. The dynamic characteristic of the PLL is basically controlled by the loop filter. When the frequency difference (fi–fr) of the index signal and reference signal is significantly large, the signal cannot pass through the loop filter due to the excessively high frequency. As a result, the signal is determined as being beyond the capture range of the loop, and the lock state is turned off. Once the loops enter the phase-locked state, the loop speed in accordance with the change in frequency fi of the index signal is only controlled by the loop filter. Additionally, even when the system is unlocked due to instance noise, the original signal can be captured since the loop filter has a short time memory ability.

However, as the unlocked time increases, the possibility to adversely affect on the loaded circuits connected to the output terminal of the VCO increases. In order to prevent this, a PLL circuit has been proposed which includes an unlock detecting circuit for detecting a phase unlock of the PLL circuit to turn on/off a PLL operation signal based on the detection signal.

When the frequency fi of the index signal is changed rapidly and significantly, the phase difference $\Delta\phi$ increases. Therefore, the oscillation frequency fo of the VCO changes great. Then, the stable time until the frequency fr of the reference signal agrees with the frequency fi of the index signal increases.

In order to prevent this, in the technology disclosed in JP-A-9-153797, as shown in FIG. 1, a limiter for limiting an output of the loop filter is provided between the loop filter and the VCO. Furthermore, a limit-value control circuit is provided therebetween for controlling the limit voltage value of the limiter in accordance with the change in frequency of the index signal.

However, conventional PLL circuits have problems mentioned in (1) and (2) below.

(1) Problems of PLL Circuit Having Unlock Detecting Circuit

A response characteristic of the PLL circuit is mainly determined by the characteristic of the loop filter. In order to operate the PLL circuit in a stable manner, the frequency pass range of the loop filter is generally set lower. However, in this case, the response to the change in reference signal may be delayed and/or the time for phase lead-in may be increased. When the frequency pass range of the loop filter is set higher in order to increase the response speed, the phase change (jitter) of the output signal is increased, which is a problem. Furthermore, when the frequency rate of the output signal and the index signal (that is, the frequency-dividing rate N of the frequency divider) increases, the phase lead-in time is difficult to be reduced.

In this way, the conventional PLL circuits have problems like a longer time for the phase lead-in at the beginning of the PLL operation. This problem becomes significant especially in the PLL circuit in which the active/inactive (that is, closed loop control/open loop control) are switched frequently by using the unlock detecting circuit.

(2) Problems of PLL Circuit Having Limiter

The stable time of the PLL circuit may be reduced, but no measures have been taken for unlocking. Furthermore, since a limit value control circuit is required for switching limit voltages of the limiter, the circuit construction becomes more complicated, which is another problem.

SUMMARY OF THE INVENTION

In order to solve the problems, according to the invention, in the PLL circuits, there is provided a phase locked loop circuit including a phase comparator for comparing phases of an index signal and reference signal and outputting a signal in accordance with the phase difference, a loop filter for smoothing the output signal of the phase comparator, a controlled oscillator (for example, the VCO and a current controlled oscillator for oscillating at a frequency in accordance with the output signal of the loop filter, and a limiter provided on a path from the output side of the phase comparator to the input side of controlled oscillator for limiting the level of a signal on the path in a predetermined range of phase differences and setting a large gain.

The phase locked loop circuit further includes a frequency divider for dividing the output signal of the controlled oscillator by a predetermined frequency dividing rate N (where N is a positive integer), generating the reference signal and feedback-inputting the reference signal to the phase comparator, an unlock detecting circuit for detecting the unlocking of a phase lock based on the index signal and the reference signal or based on the output signal of the phase comparator and for outputting an unlock detecting signal, and a switch unit for shutting up the output signal of the loop filter based on the unlock detecting signal and inputting a predetermined signal to the controlled oscillator.

BRIEF DESCRIPTION OF THE DRAWINGS

FIGS. 6A and 6B are input/output waveform diagrams of a phase detecting circuit 11 in FIG. 2;

FIG. 7 is an input/output waveform diagram of the phase detecting circuit 11 and limiter 30 shown in FIGS. 1 and 2;

DESCRIPTION OF THE PREFERRED EMBODIMENTS

[First Embodiment]
[Construction]

Figure 1:
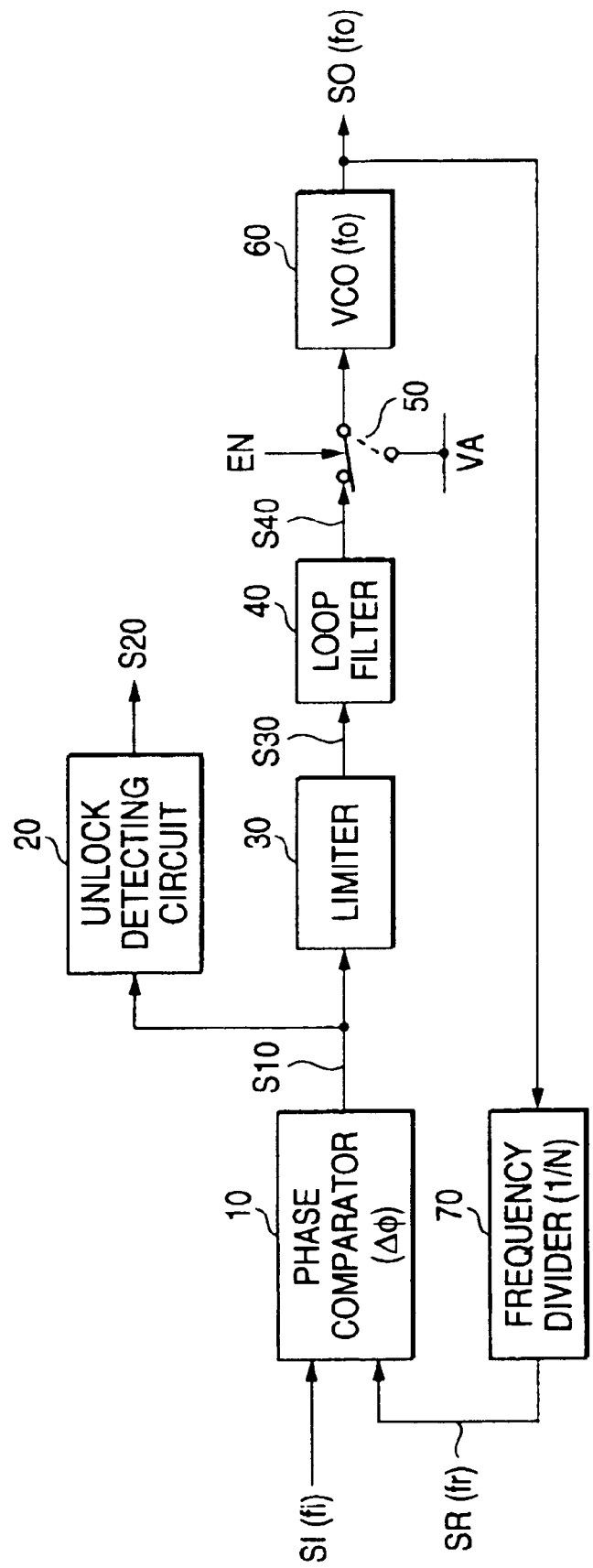
FIG. 1 is a construction diagram of a PLL circuit according to a first embodiment of the invention.

FIG. 1 is a schematic construction diagram of a PLL circuit according to a first embodiment of the invention.

The PLL circuit is, for example, a circuit to be used for a frequency multiplier and has a phase comparator 10. The phase comparator 10 is a circuit for inputting an index signal SI of a frequency fi and a reference signal SR of a frequency fr, comparing the phases of both of the inputs and generating a signal (such as a DC output voltage S10 in proportion to the phase difference $\Delta\phi$) in accordance with the phase difference $\Delta\phi$ (fi−fr). An unlock detecting circuit 20 and a limiter 30 are connected to the output side. The unlock detecting circuit 20 is a circuit for detecting the unlock of phase lock based on the DC output voltage S10 of the phase comparator 10 and outputs an unlock detecting signal S20. The limiter 30 is a circuit for setting a large gain by limiting the level of the output voltage S10 in a predetermined range within the range of a predetermined phase difference of the output voltage S10. A loop filter 40 is connected to the output side.

The loop filter 40 is a circuit for smoothing the output voltage S30. For example, the loop filter 40 includes an LPF, and a controlled oscillator (such as a VCO 60) is connected to the output side through a switch unit 50. The switch unit 50 is an element such as a transistor for connecting/shutting between the loop filter 40 and VCO 60 based on the unlock detecting signal S20 and PLL operational signal EN. For example, when the PLL operational signal EN is at logical "H" level, the switch unit 50 connects between the loop filter 40 and VCO 60. When the PLL operational signal EN is at logical "L" level due to the activation of the unlock detecting signal S20, the switch unit 50 shuts off between the loop filter 40 and VCO 60 and connects the input terminal of the VCO 60 to a predetermined fixed voltage VA node.

The VCO 60 is an oscillator, of which an oscillation frequency fo is controlled by the input voltage, for outputting an output signal SO of the oscillation frequency fo from the output terminal. The output side is feedback-connected to an input terminal of the phase comparator 10 through a frequency divider 70. The frequency divider 70 is a circuit for dividing the output signal SO of the frequency fo by a predetermined frequency-dividing rate N (where N is a positive integer), generates a reference signal SR of the frequency fr (=f0/N) and feedback-inputting the reference signal SR to the phase comparator 10. The frequency divider 70 includes a counter.

Figure 2:
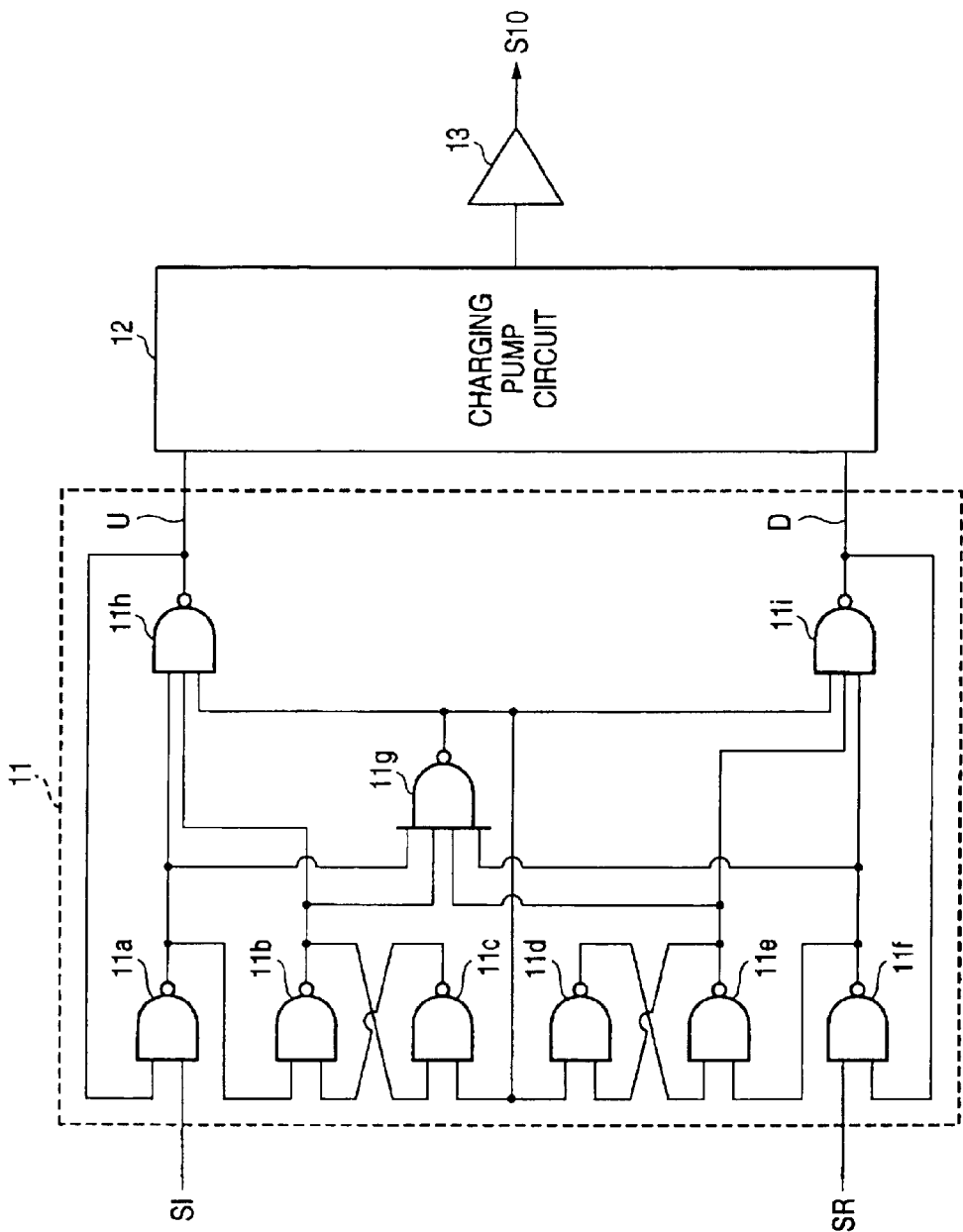
FIG. 2 is a circuit diagram of a phase comparator 10 in FIG. 1.

FIG. 2 is a circuit diagram showing a construction example of the phase comparator 10 in FIG. 1.

The phase comparator 10 is of the leading edge trigger type and has a phase detecting circuit 11. A charging pump circuit 12 is connected to the output side of the phase detecting circuit 11. Furthermore, an amplifier 13 is connected to the output side of the charging pump circuit 12.

The phase detecting circuit 11 has a 2-input NAND gate 11a for capturing an index signal SI based on the up signal U and has a 2-input NAND gate 11f for capturing a reference signal SR based on the down signal D. A first flip-flop (called FF hereinafter) is connected to the output side of the NAND gate 11a. The first FF includes two 2-input NAND gates 11b and 11c holding the output of the NAND gate 11a. Similarly, a second FF is connected to the output side of the NAND gate 11f. The second FF includes two 2-input NAND gates 11d and 11e for holding the output of the NAND gate 11f.

A 4-input NAND gate 11g is connected to the output sides of the NAND gates 11a and 11f and first and second FFs. A 3-input NAND gate 11h is connected to the output sides of the NAND gates 11a and 11g and first FF. An up signal U is output from the NAND gate 11h, is feedback-input to the NAND gate 11a and is supplied to the charging pump circuit 12. Similarly, a 3-input NAND gate 11i is connected to the output sides of the NAND gates 11f and 11g and second FF. A down signal D is output from the NAND gate 11i, is feedback-input to the NAND gate 11f and is supplied to the charging pump circuit 12. The up signal U and down signal D are stored in the charging pump circuit 12, are then amplified by the amplifier 13 and are output as the output voltage S10.

Figure 3:
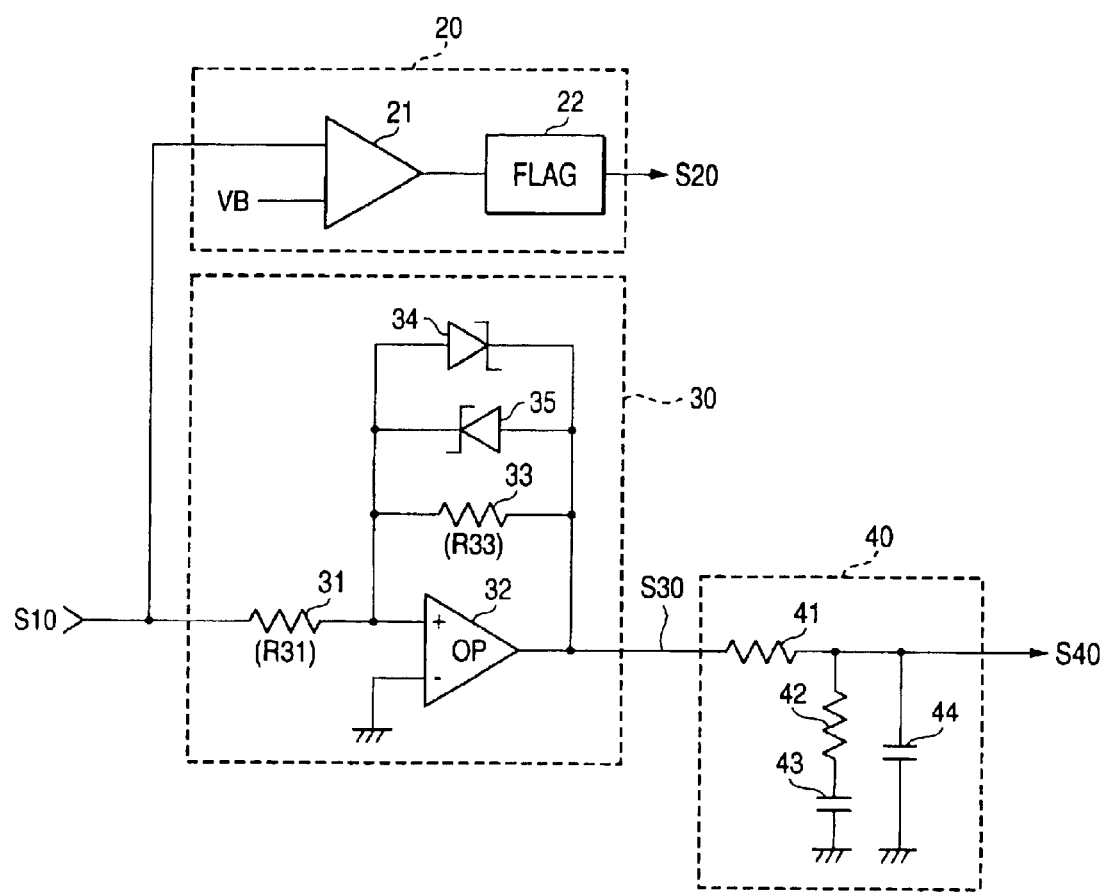
FIG. 3 is a circuit diagram of an unlock detecting circuit 20, limiter 30 and loop filter 40 in FIG. 1.

FIG. 3 is a schematic circuit diagram showing construction examples of the unlock detecting circuit 20, limiter 30 and loop filter 40 in FIG. 1.

The unlock detecting circuit 20 has a comparator 21 connected to the output side of the phase comparator 10. A flag 22 is connected to the output side of the unlock detecting circuit 20. The comparator 21 compares the output voltage S10 of the phase comparator 10 with the reference voltage VB. If S10≧VB, the comparator 21 outputs an output signal at "H" level, for example. The flag 22 is a circuit for holding the input output signal at "H" level and outputting an unlock detecting signal S20 at "H" level, for example. The flag 22 includes an FF. When the unlock detecting signal S20 at "H" level is output from the flag 22, the switch unit 60 is switched to the fixed voltage VA node side. Then, the fixed voltage VA is input to the VCO 60.

The limiter 30 has an input resistance 31 having a resistance value R31, which is connected to the output side of the phase comparator 10. The input resistance 31 is connected to a positive phase input terminal of an operational amplifier 32. A negative phase input terminal of the operational amplifier 32 is connected to the ground GND. The positive phase input terminal of the operational amplifier 32 is connected to an output terminal of the operational amplifier 32 through a feedback resistance 33 having a resistance value R33. Then, the output voltage S30 is output from the output terminal. In accordance with the selection of the resistance values R31 and R33, the gain G(=S30/S10=R33/R31) of the operational amplifier 32 is set to be large. A forward Zener diode 34 and a reverse Zener diode 35 are connected to the feedback resistance 33 in parallel, and the maximum level and minimum level of the output voltage S30 are limited.

The loop filter 40 is a lag-lead type LPF and has resistances 41 and 42 and a capacitor 43 to which the output voltage S30 of the limiter 30 is input. A capacitor 44 is connected to the resistance 42 and capacitor 43 in parallel. The capacitor 44 is provided for addressing noise and only needs about 1/10 of the capacity of the capacitor 43. The capacitor 44 may be eliminated if not necessary.

Figure 4:
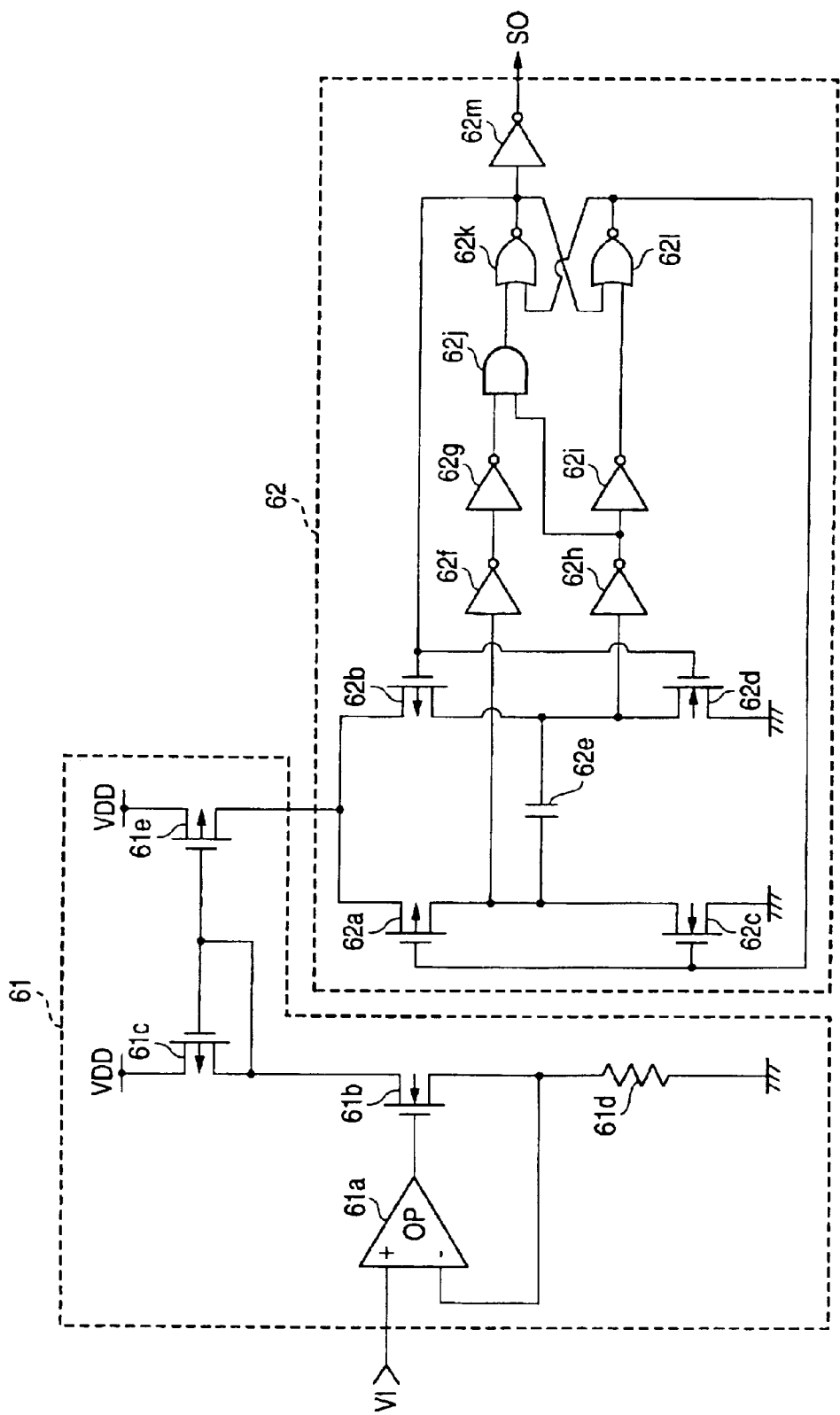
FIG. 4 is a circuit diagram of a VCO 60 in FIG. 1.

FIG. 4 is a schematic circuit diagram showing a construction example of the VCO 60 in FIG. 1.

The VCO 60 is a multi-vibrator type oscillator and has a voltage/current converting portion 61 for converting an input voltage VI (=output voltage S40 or the loop filter 40 or fixed voltage VA) to current. An oscillating portion 62 is connected to the output side of the VCO 60.

The current/voltage converting portion 61 has an operational amplifier 61a. The positive phase input terminal of the operational amplifier 61a is connected to the output side of the switch unit 50. The output terminal of the operational amplifier 61a is connected to the gate of an N-channel type MOS transistor (called "NMOS" hereinafter) 61b. The source of the NMOS 61b is connected to the reverse phase input terminal of the operational amplifier 61a. The drain of the NMOS 61b is connected to the power source voltage VDD through a P-channel type MOS transistor (called "PMOS" hereinafter) 61c. The source of the NMOS 61b is connected to the ground GND through a resistance 61d. The gate and drain of the PMOS 61c is connected to the gate of the PMOS 61e establishing a current mirror circuit.

When the input voltage VI is input to the operational amplifier 61a, the gate of the NMOS 61b is controlled by the output of the operational amplifier 61b. The current in accordance with the input voltage VI flows through the PMOS 61c, and the current in proportion to the current flowing through the PMOS 61c also flows through the PMOS 61e and is supplied to the oscillating portion 62.

The oscillating portion 62 has PMOS 62a and 62b. The sources of the PMOS 62a and 62b are connected to the drain of the PMOS 61e. The drains of the PMOS 62a and 62b are connected to the ground GND through the NMOS 62c and 62d, respectively. The drains of the PMOS 62a and 62b are connected to each other through the capacitor 62e. Inverters 62f, 62g, 62h and 62i for signal inversion are connected to the drains of the PMOS 62a and 62b. The output side of the inverters 62g and 62h is connected to a 2-input AND gate 62j. An RS-FF having two 2-input NOR gate 62k and 62l is connected to the output side of the AND gate 62j and inverter 62i. The output side of the RS-FF is feedback-connected to the gates of the PMOS 62a, 62b and NMOS 62c and 62d and connected to an inverter 62m for driving. Output signals SO are output from the inverter 62m.

When current is supplied from the PMOS 61e, the current is amplified in the oscillating circuit having the PMOS 62a, 62b, NMOS 62c and 62d and capacitor 62e. The amplified signal is inverted by the inverters 62f, 62g, 62h, and 62i. The inverted signal is held in the RS-FF having the NOR gates 62k and 62l through the NAND gate 62j. Then, the signal is feedback-input to the gates of the PMOS 62a and 62b and NMOS 62c and 62d. Thus, the oscillating portion 62 oscillates at the frequency fo in proportion to the input voltage VI, and the output signal SO is output from the inverter 62m.

[Operations]

Figure 5:
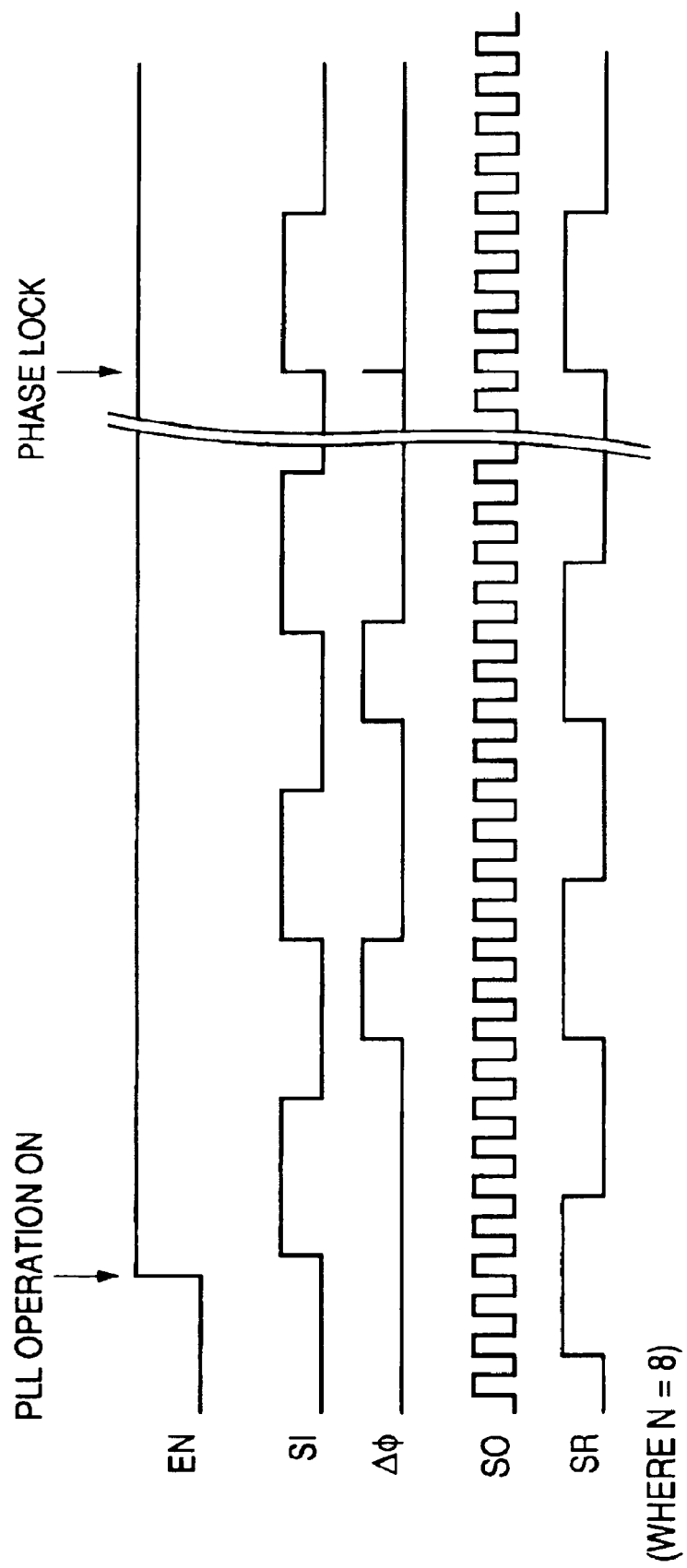
FIG. 5 is an operational waveform diagram of the first embodiment in FIG. 1.

FIG. 5 is an operational waveform diagram of the first embodiment (where the frequency dividing rate N=8, for example) in FIG. 1. FIGS. 6A and 6B are input/output waveform diagrams of the phase detecting circuit 11 in FIG. 2. More specifically, FIG. 6A is a waveform diagram where a reference signal SR waveform delays with respect to an index signal SI waveform. FIG. 6B is a waveform diagram where the reference signal SI waveform delays with respect to the reference signal SR waveform. FIG. 7 is an input/output waveform diagram of the phase detecting circuit 11 and limiter 30 in FIGS. 1 and 2.

Operations of the PLL circuit in FIG. 1 will be described with reference to FIGS. 5 to 7.

In FIG. 5, when a power source voltage is applied to the PLL circuit, the PLL circuit operates. The fixed voltage VA is applied to the VCO 60 through the switch unit 50. The VCO 60 oscillates at a constant frequency fo. The output signal SO of the VCO 60 is divided by N (=8) by the frequency-divider 70. The reference signal SR at the frequency fr (=fo/N) is generated and is feedback-input to the phase comparator 10.

When a PLL operational signal EN at "H" level is input and the PLL operation is turned on, the switch unit 50 is switched to the loop filter 40 side. The output voltage S40 of the loop filter 40 is input to the VCO 60. Th VCO 60 oscillates at the frequency fo in accordance with the output voltage S40. The output signal SO of the VCO 60 is divided by the frequency divider 70, and the reference signal SR is created and is feedback-input to the phase comparator 10. In response to the turning on the PLL operation, the index signal SI at the frequency fi is input to the phase comparator 10. The phase detecting circuit 11 within the phase comparator 10 compares the phases of the index signal SI at the frequency fi and reference signal SR at the frequency fr. For example, when, as shown in FIG. 6A, the reference signal SR delays with respect to the index signal SI, an up signal U is output from the NAND gate 11h within the phase detecting circuit 11. On the other hand, when, as shown in FIG. 6B, the index signal SI is later than the reference signal SR, a down signal D is output from the NAND gate 11i of the phase detecting circuit 11.

Here, the input/output conducting characteristic of the phase detecting circuit 11 will be described with reference to FIG. 7.

In the input/output waveform diagram in FIG. 7, the horizontal axis indicates the phase differences $\Delta\phi$ (radian) between the index signal SI and the reference signal SR. The vertical line indicates the average output voltage V11 (V) of the phase detecting circuit 11.

A curve C1 of the input/output conducting characteristic of the phase detecting circuit 11 has a sawtooth waveform as indicated by a broken line in FIG. 7 and has a wider straight line range of $4\pi$ radian (that is, from $-2\pi$ radian$+2\pi$ radian). The phase detection conversion gain K11 (V/rad.) is obtained by:

$$K11\,V11/\Delta\phi$$

and, the average value is 0.12 V/rad., for example. When the phase difference $\Delta\phi$ varies from $-2\pi$ radian to $+2\pi$ radian, the up signal U and down signal D vary substantially up to +0.75 V to +2.25 V. These up signal U and down signal D are stored in the charging pump circuit 12 and are amplified by the amplifier 13. Then, the output voltage S10 is output from the amplifier 13 and is supplied to the unlock detecting circuit 20 and limiter 30.

The maximum level and the minimum level of the output voltage S10 of the phase comparator 10 are limited by the limiter 30 and are smoothed by the loop filter 40. Then, the output voltage S40 closer to DC is generated. The output voltage S40 is returned to the VCO 60 through the switch unit 50. As a result, the frequency fo of the VCO 60 varies to the less frequency difference (fi-fr).

This processing continues until the frequency fr of the reference signal SR agrees with the frequency fi of the index signal SI and the frequency difference (fi-fr) reaches zero. When the frequency fr agrees with the frequency fi, the phase locked state is obtained. During the locked state, the frequency f0 of the VCO 60 is proportional to the frequency fi of the input index signal SI except for some finite phase differences. Because of the repeated operation of the loop system, in the phase-locked state, the output signal SO in accordance with the change in index signal SI and by N times of frequency rate of the index signal SI in the same phase is output from the output terminal of the VCO 60.

When the phase difference $\Delta\phi$ increases due to, for example, the change in frequency fi of the index signal SI and the locked state is turned off, the unlock is detected by the unlock detecting circuit 20. Then, the unlock detecting signal S20 is output. Then, the PLL operational signal EN is turned to "L" level, and the PLL operation is turned off. The switch unit 50 is turned to the fixed voltage VA node side, and the VCO 60 oscillates at a constant frequency fo due to the fixed voltage VA. After that, when the PLL operational signal EN is turned to "H" level, the PLL operation is turned on. Then, the above-described operation is performed.

Next, a response characteristic of the PLL circuit will be described.

The DC loop gain K of the PLL circuit is obtained by:

$$K=K11\times K60$$

where K11 is a phase detection conversion gain (V/rad) of the phase comparator 10, K60 is a modulation sensitivity (gain) of the VCO 60 (rad/s/V) and K60=output frequency fo/input voltage VI.

In order to increase the frequency following speed (that is, response speed) of the reference signal SR for the change in frequency of the index signal SI, the gain K may be increased, for example. However, when the gain K is increased, the overshoot may increase and/or the settling time until the steady state may increase. Thus, the phase change (jitter) characteristic of the output signal S decreases. In order to prevent this, the resistances 41 and 42 and capacitor 43 of the loop filter 40 must be designed with optimum values. The resistances 41 and 42 and capacitor 43 are important elements for determining the response characteristic of the PLL.

When the limiter 30 is not used, the input phase difference $\Delta\phi$ and the output voltage S10 are proportional in the range where the phase difference $\Delta\phi$ is $-2\pi$ to $2\pi$ radian as indicated by the curve C1 in FIG. 7. The slope is the conversion gain K11. When the limiter 30 is not used and when the output voltage S10 is set to correspond to the entire range ($-2\pi$ to $+2\pi$ radian) of the input phase difference $\Delta\phi$, the conversion gain K11 must be small. Therefore, the response speed decreases.

In order to overcome these technical problems, the limiter 30 is provided in this embodiment. A curb C2 of the input/output conducting characteristic when the limiter 30 is used is indicated by a solid line in the input/output waveform diagram in FIG. 7.

In the limiter 30 shown in FIG. 3, the output voltage S10 of the phase comparator 10 is amplified by the operational amplifier 32 with the gain G (=S30/S10=R33/R31). In this case, the maximum level and the minimum level of the amplification value are limited by the Zener diodes 34 and 35. The output voltage S30 of the limited amplification value is output.

Therefore, the gain G of the operational amplifier 32 is increased by the selection of resistance values R31 and R33, and the conversion gain K11 is set larger only in the range having the input phase difference $\Delta\phi$. Thus, the jitter characteristic of the output signal SO can be improved, and the change in frequency of the output signal SO can be decreased.

[Advantages]

This embodiment has advantages as described in (1) and (2) below.

(1) When the limiter 30 is not used, it has been difficult to maintain both of the response characteristic of the PLL circuit and the jitter characteristic of the output signal SO. However, by providing the limiter 30 thereto, the conversion gain K11 can be set larger even when the input phase difference $\Delta\phi$ is small. Thus, the jittering characteristic of the output signal SO can be improved, and the change in frequency of the output signal SO can be reduced. Therefore, the phase lead-in time can be reduced at the start of the PLL operation.

(2) Since a circuit for switching the limit voltage of the limiter as disclosed in JP-A-9-153797 is not required, the simpler circuit construction can be obtained. Furthermore, the PLL operation can respond to unlocking precisely.

[Second Embodiment]

[Construction]

Figure 8:
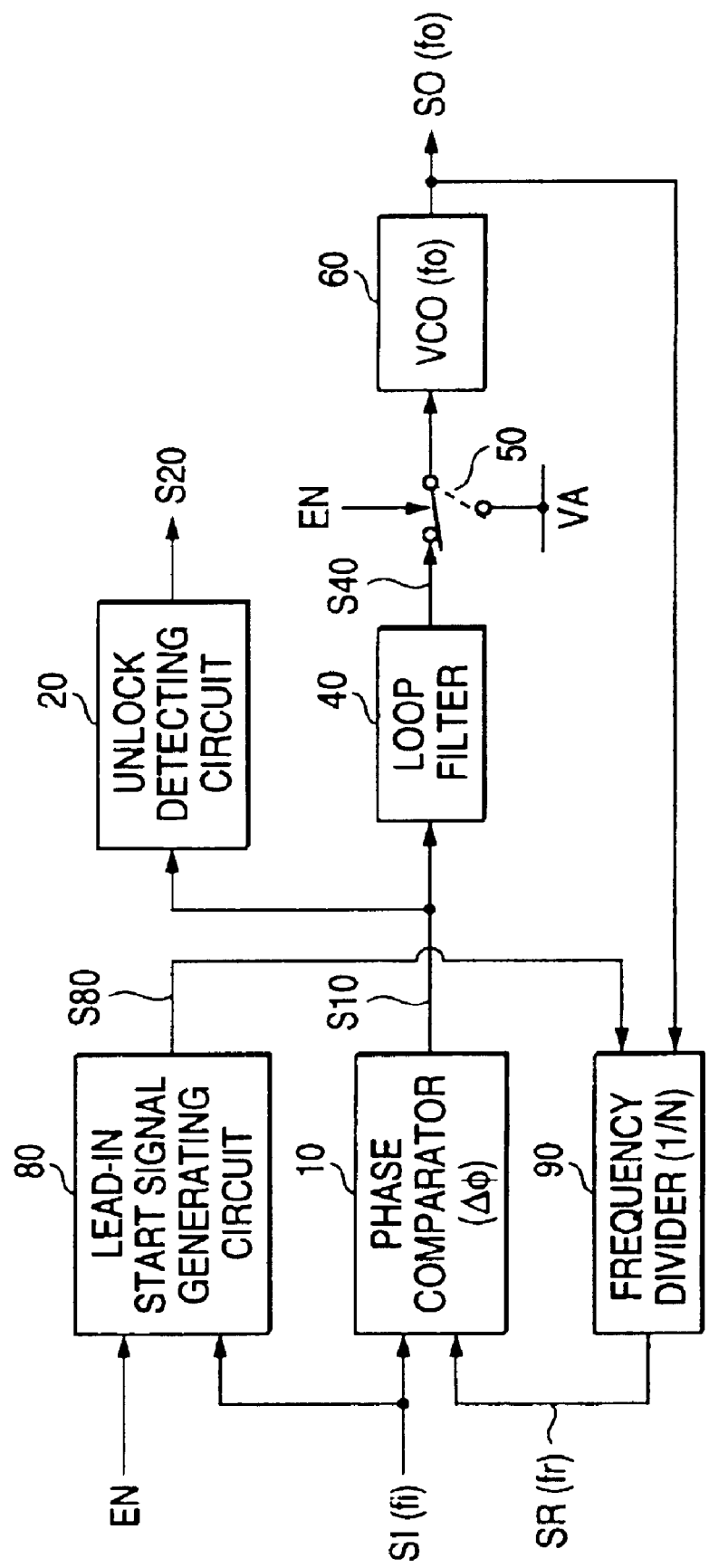
FIG. 8 is a construction diagram of a PLL circuit according to a second embodiment of the invention.

FIG. 8 is a schematic construction diagram of a PLL circuit according to a second embodiment of the invention. The same reference numerals are given to the same components as those shown in FIG. 1 according to the first embodiment.

According to this embodiment, a lead-in start signal generating circuit 80 is newly added to the PLL circuit according to the first embodiment. This embodiment is different from the first embodiment in that a preset frequency divider 90 is provided instead of the frequency divider 70 in FIG. 1. The other construction is the same as the one shown in FIG. 1.

The lead-in start signal generating circuit 80 is a circuit for generating a lead-in start signal S80 in response to an input index signal SI when a PLL operational signal EN is at "H" level and an PLL operation (closed loop) starts. The output side is connected to a preset terminal P of the preset frequency divider 90.

The preset frequency divider 90 is connected between the output side of the VCO 60 and the input side of the phase comparator 10. The frequency divider 90 outputs a reference signal SR having the minimum phase difference $\Delta\phi$ from the index signal SI when the lead-in start signal S80 is input to the preset terminal P. The frequency-divider 90 feedback-inputs the reference signal SR to the phase comparator 10. Then, when an output signal SO of the VCO 60 is input to the frequency divider 90, the frequency divider 90 divides the output signal SO by a predetermined frequency-dividing rate N (for example, N=8) and outputs a reference signal SR. The frequency divider 90 feedback-inputs the reference signal SR to the phase comparator 10.

Figure 9:
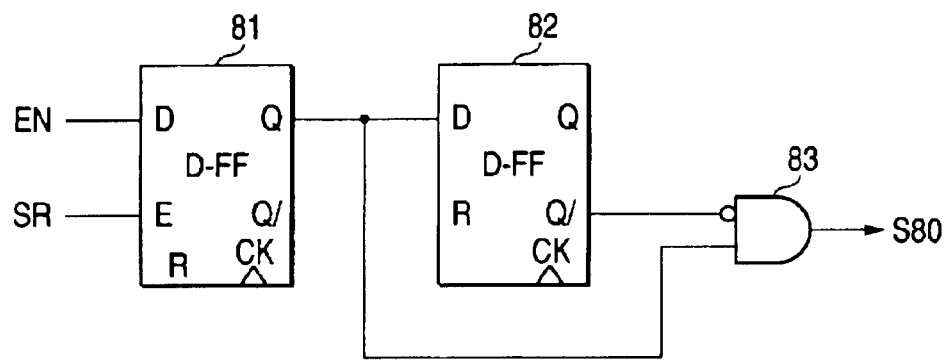
FIG. 9 is a circuit diagram of a lead-in start signal generating circuit 80 in FIG. 8.

FIG. 9 is a schematic circuit diagram showing a construction example of the lead-in start signal generating circuit 80 in FIG. 8.

The lead-in start signal generating circuit 80 has an FF (such as a delay-type FF called "D-FF" hereinafter) 81 for capturing PLL operational signals EN at the edge (such as the leading edge) of the index signal SI. One or multiple delay FF (such as D-FF) 82 are connected to the output terminal Q. A 2-input AND gate 83 is connected to an output terminal Q of the D-FF 81 and an inversion output terminal Q/ of the D-FF 82. The 2-input AND gate 83 outputs lead-in start signals S80.

In other words, the D-FF 81 has an input terminal D for inputting PLL operational signals EN, an input terminal E for inputting index signals SI, a clock input terminal CK, a reset terminal R, the output terminal Q and the inversion output terminal Q/. Immediately after a PLL operational signal EN at "H" level is input to the D-FF 81, the D-FF 81 captures the "H" level of the PLL operational signal EN at the falling edge of the index signal SI and turns the output terminal Q to "H" level. The input terminal D of the D-FF 82 and one input terminal of the AND gate 83 are connected to the output side terminal Q.

The D-FF 82 has an input terminal D connected to the output terminal Q of the D-FF 81, a clock input terminal CK, a reset terminal R, an output terminal Q, and an inversion output terminal Q/. The D-FF 82 delays "H" level of the output signal of the D-FF 81 by a predetermined period of time and outputs an output signal at "L" level from the inversion output terminal Q/. The other input terminal of the AND gate 83 is connected to the inversion output terminal Q/ through an inverter for signal inversion.

The AND gate 83 outputs a lead-in start signal S80 having a pulse width corresponding to the time difference of leading edges of two inputs after the falling edge of the index signal SI immediately after "H" level of a PLL operational signal EN.

Figure 10:
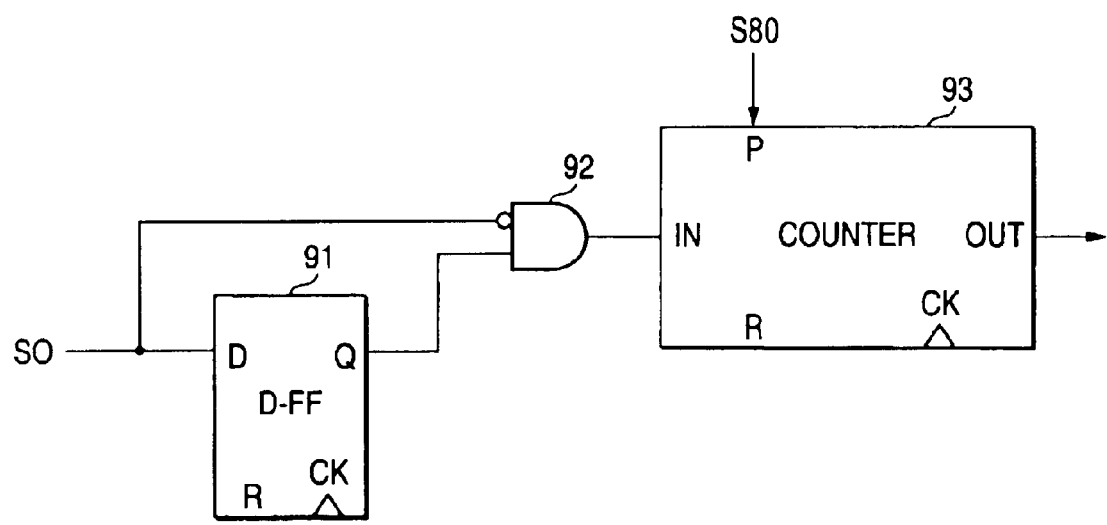
FIG. 10 is a circuit diagram of a frequency divider 90 having a preset in FIG. 8.

FIG. 10 is a schematic circuit diagram showing a construction example of the preset frequency divider 90 in FIG. 8.

The preset frequency divider 90 with a preset may be a variable frequency dividing circuit with a preset and has one or multiple FF (such as D-FF) 91 for capturing and delaying the output signal SO of the VCO 60. One input terminal of a 2-input AND gate 92 is connected to the output terminal Q of the D-FF 91 through an inverter for signal inversion. The output signals SO are input to the other input terminal. The AND gate 92 is a circuit for generating a counter input pulse from the edge of the output signal SO delayed by the D-FF 91. An input terminal IN of a counter (such as a 12-bit down counter) 93 is connected to the output terminal of the AND gate 92.

The counter 93 has the input terminal IN connected to the output terminal of the AND gate 92, a clock terminal CK, a reset terminal R, a preset terminal P to which a lead-in start signal S80 is input and an output terminal OUT for outputting a reference signal SR. The counter 93 down-counts output pulses of the AND gate 92, which are input from the input terminal IN. When a lead-in start signal S80 is input to the preset terminal P, the count value is set to a predetermined value (such as zero (0)), and the counter 93 outputs a reference signal SR from the output terminal OUT.

[Operations]

Figure 11:
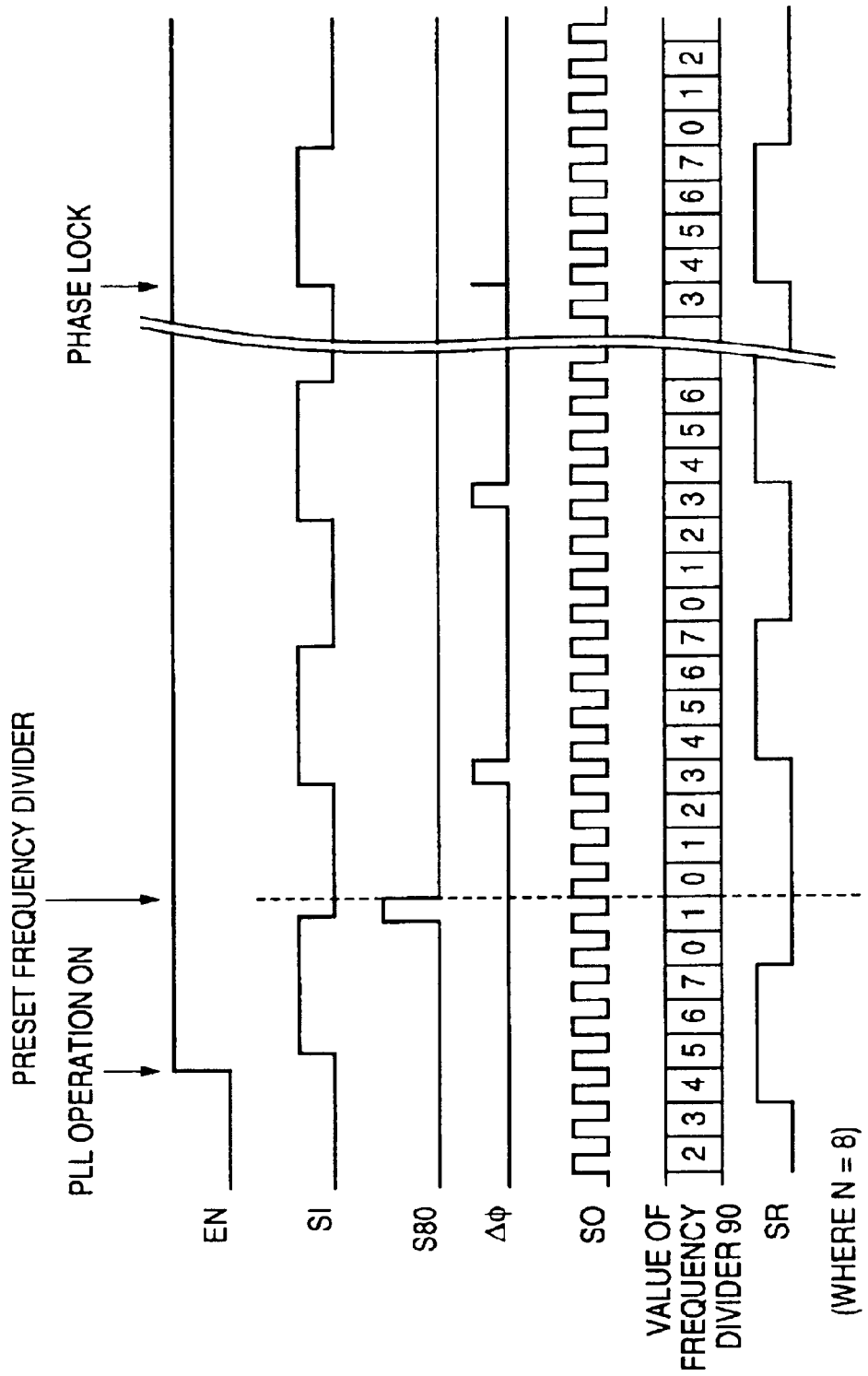
FIG. 11 is an operational waveform diagram in FIG. 8.

FIG. 11 is an operational waveform diagram of the PLL circuit shown in FIG. 8. The operations of the PLL circuit in FIG. 8 will be described with reference to FIG. 11.

In FIG. 11, when power source voltage is applied, the PLL circuit operates. Then, the fixed voltage VA is applied to the VCO 60 through the switch unit 50. Then, the VCO 60 oscillates at a constant frequency fo. The output signal SO of the VCO 60 is divided by N (=8) by the frequency divider 90. The reference signal SR of the frequency fr (=fo/N) is generated and is feedback-input to the phase comparator 10.

When the PLL operational signal EN at "H" level is input and the PLL operation is turned on, the switch unit 50 is switched to the loop filter 40 side. The index signal SI at the frequency fi is input to the phase comparator 10 and the lead-in start signal generating circuit 80. In the lead-in start signal generating circuit 80 in FIG. 9 generates a lead-in start signal S80 and supplies the signal to the frequency divider 90 at the falling edge of the first pulse of the index signal SI immediately after the PLL operational signal EN is turned to "H" level.

In the counter 93 within the frequency divider 90 in FIG. 10, when the lead-in start signal S80 is input to the preset terminal P, a down count value is preset and is set to a value (such as zero (0) so as to fit within one clock) set in advance so as to have the smallest phase difference $\Delta\phi$. The preset value is output from the output terminal OUT as a reference signal SR and is supplied to the phase comparator 10. Then, phases of the index signal SI at the frequency fi and the reference signal SR at the frequency fr are compared in the phase comparator 10, and the phase difference $\Delta\phi$ between the index signal SI and the reference signal SR can be obtained. Since the phase difference $\Delta\phi$ is set in advance so as to fit within one clock, the minimum output voltage S10 is output from the phase comparator 10.

The minimum output voltage S10 is smoothed by the loop filter 40 and is returned to the VCO 60 through the switch unit 50. Thus, the frequency fo of the VCO 60 varies so as to have a smaller frequency difference (fi–fr). When the frequency fr of the reference signal SR agrees with the frequency fi of the index signal SI, a phase locked state can be obtained. Thus, the output signal SO N times of frequency rate in phase with the index signal SI is output from the output terminal of the VCO 60.

In this operation, since the phase difference $\Delta\phi$ between the index signal SI and the reference signal SR output from the frequency divider 90 is within one clock of the clock cycle after the preset of the frequency divider 90, the phase difference Δφ can be small immediately after the start of the PLL operation. As a result, the lead-in time of the PLL operation can be reduced.

When the phase difference Δφ becomes larger due to the change in frequency fi of the index signal SI and when the locked state is turned off, the unlock detecting circuit 20 operates like the first embodiment.

[Advantages]

According to this embodiment, the lead-in start signal S80 is output from the lead-in start signal generating circuit 80 in the beginning of an PLL operation (closed loop), and a reference signal SR having the minimum phase difference Δφ with the index signal SI is output from the frequency divider 90. Therefore, the output voltage S10 of the phase comparator 10 can be reduced immediately after the start of the PLL operation. Thus, the time until the phase lock of the PLL circuit can be reduced with a simpler circuit construction.

[Third Embodiment]
[Construction]

Figure 12:
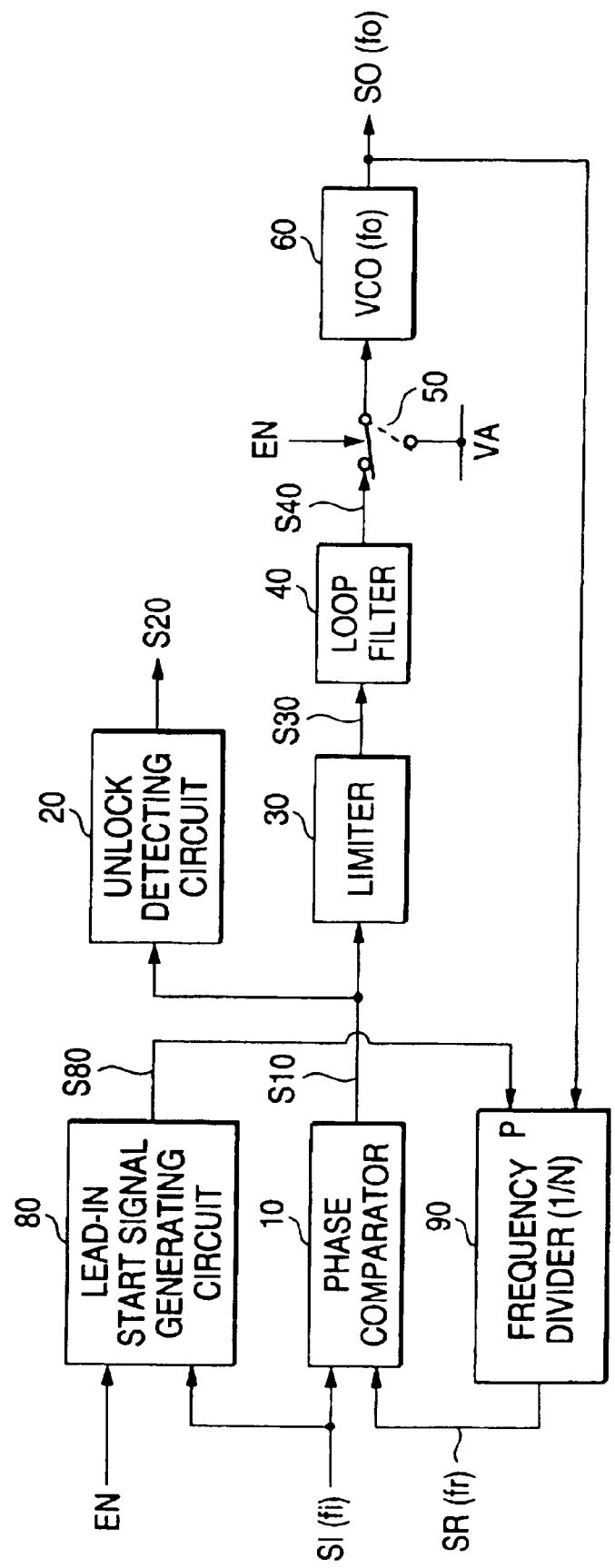
FIG. 12 is a construction diagram of a PLL circuit showing a third embodiment of the invention.

FIG. 12 is a schematic construction diagram of a PLL circuit according to a third embodiment of the invention. The same reference numerals are given to the same components as those in FIG. 1 according to the first embodiment and in FIG. 8 according to the second embodiment.

In the PLL circuit according to this embodiment, the limiter 30 in FIG. 1 is connected between the phase comparator 10 and the loop filter 40 of the PLL circuit in FIG. 8. The other constitution is similar to FIG. 1 and FIG. 8.

[Operations]

Like the first embodiment, when a PLL operation is turned on, the limiter 30 operates. Because of the limiter 30, the conversion gain K11 can be set to be large. Therefore, the jitter characteristic of the output signal SO can be improved. However, as shown in FIG. 7, the response characteristic becomes lower to signals beyond the range determined by the input phase difference Δφ.

Therefore, according to this embodiment, the lead-in start signal generating circuit 80 and frequency divider 90 with a preset like those according to the second embodiment are provided. Then, the output voltage S10 of the phase comparator 10 is lowered immediately after the start of the PLL operation. Thus, the output voltage S10 of the phase comparator 10 is suppressed within the determined range of the limiter 30 shown in FIG. 7, and the signals beyond the range are not responded. Therefore, the adverse effects by the addition of the limiter 30 can be minimized.

[Advantages]

This embodiment has advantages as described in (1) and (2) below.

(1) When the unlocking is determined because the output voltage S10 of the phase comparator 10 is large, the phase lead-in and lock operation are performed by operations of the loop circuit conventionally. Therefore, the lead-in takes time. On the other hand, according to this embodiment, even when unlocked, another PLL operation is restarted (closed loop) after one PLL operation is turned off (open loop) once. Therefore, the phase lock operation can be recovered extremely fast.

(2) Conventionally, when one clock of the index signal SI is handled as a unit, 3000 to 4000 clocks are required until the phase locking. For this embodiment, a circuit was established experimentally, and effects of a PLL circuit were checked with the index signal frequency fi=15.735 KHz. The output signal frequency fo=27 MHz and the frequency dividing rate N=1716. As a result, about 50 clocks were required, which is significantly reduced, until the phase clock according to this embodiment.

[Fourth Embodiment]

The PLL circuits according to the first to third embodiments may be other digital type circuits. A circuit construction example according to a fourth embodiment is shown in FIGS. 13A to 16.

Figure 13A:
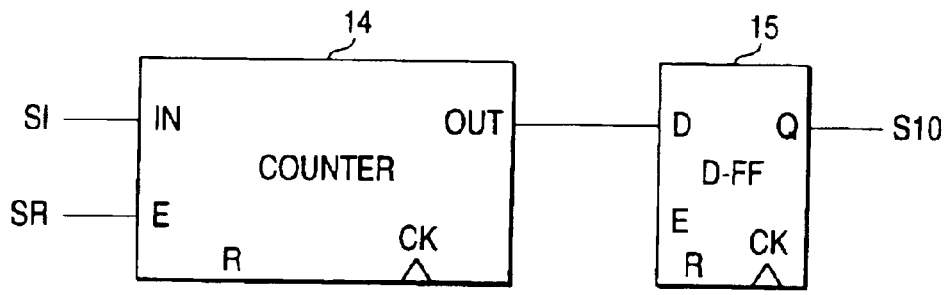
FIGS. 13A and 13B are construction diagrams of a phase comparator according to a fourth embodiment of the invention.
Figure 13B:
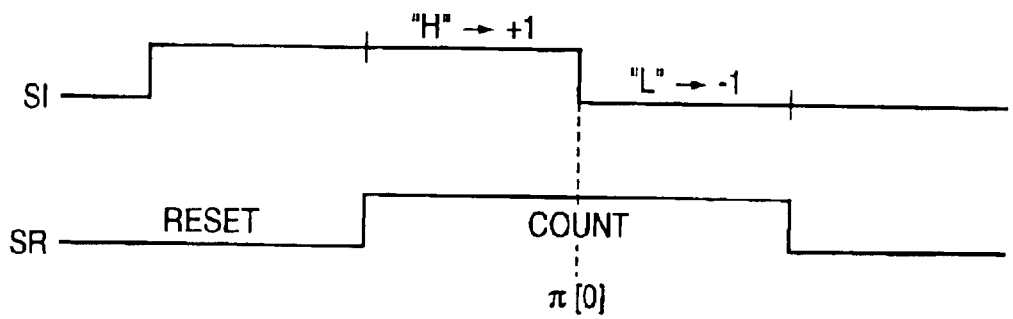

FIGS. 13A and 13B are schematic construction diagrams of a digital type phase comparator. More specifically, FIG. 13A is a circuit diagram while FIG. 13B is an operational waveform diagram.

The phase comparator includes an up/down counter 14 and a D-FF 15. The counter 14 operates in response to a digital reference signal SR. When a digital index signal SI is at "H" level, the counter 14 up-counts the clock by +1. When the phase difference Δφ is π/2 radian, the count value is zero (0). When the digital index signal SI is at "L" level, the counter 14 down-counts the clock by −1. These count values are held in the D-FF 15 and are output as digital output signals S10.

Figure 14A:
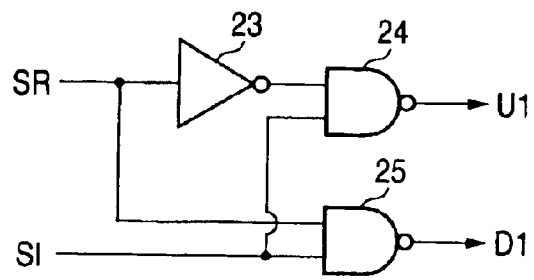
FIGS. 14A and 14B are construction diagrams of an unlock detecting circuit according to the fourth embodiment of the invention.
Figure 14B:
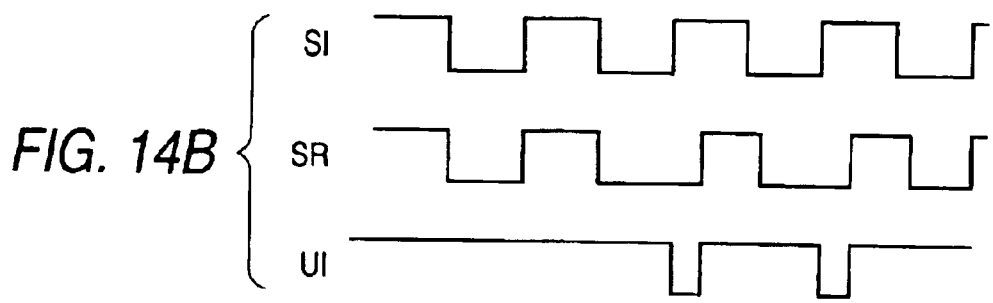

FIGS. 14A and 14B are schematic construction diagrams of a digital type unlock detecting circuit. More specifically, FIG. 14A is a circuit diagram while FIG. 14B is an operational waveform diagram.

The unlock detecting circuit includes an inverter 23 for logical inversion and 2-input NAND gates 24 and 25. The digital reference signal SR and the digital index signal SI are compared. If the PLL loop is in a phase-locked state, the output terminal U1 remains at logical "1". If the PLL loop is unlocked, negative pulses having a width in proportion to the unlock amount appear in the output terminal U1. The output of the output terminal U1 can be used to detect the unlocking.

Figure 15:
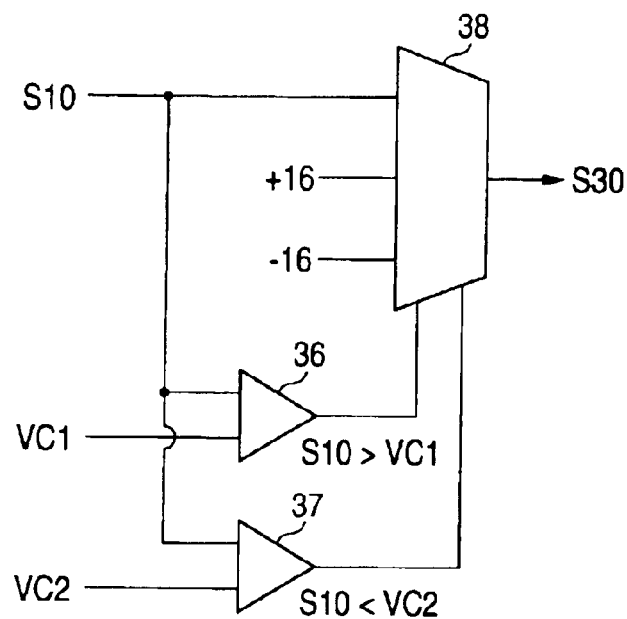
FIG. 15 is a construction diagram of a limiter according to the fourth embodiment of the invention.

FIG. 15 is a schematic circuit diagram of a digital type limiter.

The limiter includes comparator 36 and 37 and a selector 38. The digital output voltage S10 and digital comparative voltages VC 1 and VC 2 are input to the comparators 36 and 37 and the selector 38, and digital values, "+16" and "−16" are input to the selector 38. The comparator 36 compares the voltages S10 and VC1, and the comparator 37 compares the voltage S10 and the VC2. If S10>VC1, the value, "+16", is selected by the selector 38, and the digital output voltage S30 is output. If VC1>S10>VC2, S10 is selected and is output by the selector 38. If S10 <VC2, the value, "−16", is selected and is output by the selector 38.

Figure 16:
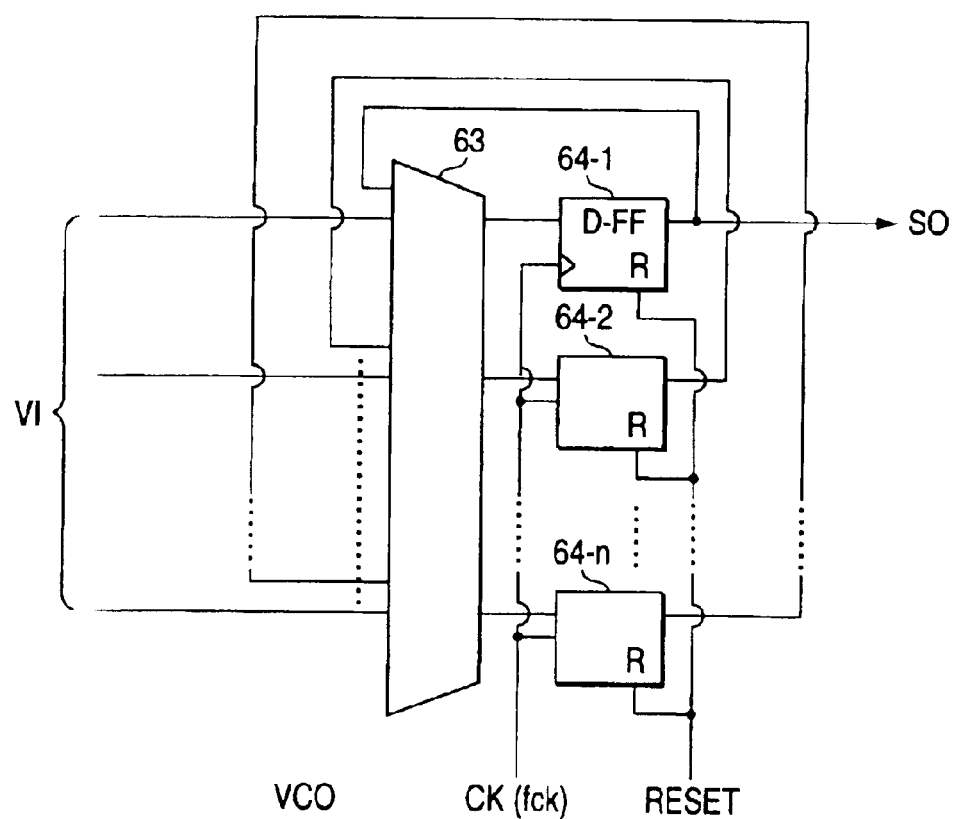
FIG. 16 is a construction diagram of a VCO according to the fourth embodiment of the invention

FIG. 16 is a schematic circuit diagram of the digital type VCO.

The VCO includes an n-bit adder 63, and n D-FF/64-1 to 64-n for latching the output value of the adder 63 by using a clock CK at a frequency fck. The n-bit digital input voltage VI and the output values of n D-FF 64-1 to 64-n are added in the adder 63, and the digital output signal SO is output from the D-FF 64-1. The output signal frequency fo is expressed by:

$$fo = fck \times (VI/2_n)$$

[Applicability]

The invention is not limited to the above-described embodiments, and various variations and forms of use are possible. The various variations and forms of use include those described in (1) to (6) below.

(1) The analog type phase comparator 10 in FIG. 2 only needs to output a phase comparison result in analog value (that is, only needs to output a phase difference Δφ in time occupying in a cycle) and may be a different analog type circuit. Furthermore, the digital type phase comparator in FIG. 13 only needs to output a phase comparison result in digital value (that is, only needs to output a phase difference Δφ in count value) and may be a different digital type circuits.

(2) The limiter 30 is provided between the phase comparator 10 and the loop filter 40 in the embodiments but may be provided between the loop filter 40 and the VCO 60. Thus, substantially the same effects and advantages can be obtained as those in the embodiments. Furthermore, the digital type limiter in FIG. 15 may have a different digital type circuit construction.

(3) The loop filter 40 may be replaced by a different analog type filter such as a lag-lead type LPF using an operational amplifier instead of the one shown in FIG. 3.

(4) The VCO 60 in FIG. 4 may be replaced by a different analog type VCO such as a CR oscillator and a ring oscillator. Furthermore, the digital type VCO in FIG. 16 may adopt a different digital type circuit construction.

(5) A control oscillator may be an analog type or digital type current controlled oscillator. For example, when the control oscillator is an analog type current controlled oscillator, the oscillator 62 shown in FIG. 4 may be used.

(6) The type, analog or digital, of the loop filter 40 and limiter 30 may depend on the type, analog or digital, of the phase comparator 10 and controlled oscillator. In either case, the invention is applicable.

As described above, according to the invention, a limiter is provided in a PLL circuit having an unlock detecting circuit for limiting the maximum level of the absolute value of a signal passing in a predetermined range of phase differences so as to set a larger gain. Therefore, the jittering characteristic of output signals can be improved, and the change in frequency of the output signals can be reduced. Thus, the phase lead-in time at the start of a PLL operation can be reduced. Furthermore, with a simpler circuit construction, a PLL operation precise for unlocking becomes possible.

When a lead-in start signal generating circuits provided instead of the limiter, the output of the phase comparator can be small immediately after the start of a PLL operation. Therefore, with a circuit construction, the time until the phase lock of the PLL circuit can be reduced.

When a limiter and a lead-in start signal generating circuit are provided, the output of the limiter is suppressed in a predetermined range of input phase differences. Therefore, signals beyond the range are not responded to. As a result, the above effects can be obtained while minimizing the adverse effects due to the existence of the limiter.

What is claimed is:

1. A phase locked loop circuit, comprising
a phase comparator for comparing phases of an index signal and a reference signal and outputting a signal in accordance with the phase difference;
a loop filter for smoothing the output signal of the phase comparator;
a controlled oscillator for oscillating at a frequency in accordance with an output signal of the loop filter;
a limiter provided on a path from the output side of the phase comparator to the input side of the controlled oscillator for limiting the level of signals on the path in a predetermined range of phase differences and setting a large gain;
a frequency divider for dividing an output signal of the controlled oscillator by a predetermined frequency dividing rate N (where N is a positive integer), generating the reference signal and feedback-inputting the reference signal to the phase comparator;
an unlock detecting circuit for detecting unlocking of a phase lock based on the index signal and the reference signal or based on the output signal of the phase comparator and for outputting an unlock detecting signal; and
a switch unit for shutting up the output signal of the loop filter based on a PLL operational signal and inputting a predetermined signal to the controlled oscillator.

2. A phase locked loop circuit, comprising
a phase comparator for comparing phases of an index signal and a reference signal and outputting a signal in accordance with the phase difference;
a lead-in start signal generating circuit for generating a lead-in start signal in response to the index signal at the start of an operation;
a loop filter for smoothing the output signal of the phase comparator;
a controlled oscillator for oscillating at a frequency in accordance with an output signal of the loop filter;
a frequency divider for generating the reference signal having the minimum phase difference with respect to the index signal when the lead-in start signal is input, feedback-inputting the reference signal to the phase comparator, generating the reference signal by dividing the output signal of the controlled oscillator by a predetermined frequency dividing rate N (where N is a positive integer) when an output signal of the controlled oscillator is input, and feedback-inputting the reference signal to the phase comparator;
an unlock detecting circuit for detecting the unlocking of a phase lock based on the index signal and the reference signal or based on the output signal of the phase comparator and for outputting an unlock detecting signal; and
a switch unit for shutting up the output signal of the loop filter based on a PLL operational signal and inputting a predetermined signal to the controlled oscillator.

3. A phase locked loop circuit, comprising
a phase comparator for comparing phases of an index signal and a reference signal and outputting a signal in accordance with the phase difference;
a lead-in start signal generating circuit for generating a lead-in start signal in response to the index signal at the start of an operation;
a loop filter for smoothing the output signal of the phase comparator;
a controlled oscillator for oscillating at a frequency in accordance with an output signal of the loop filter;
a limiter provided on a path from the output side of the phase comparator to the input side of the controlled oscillator for limiting the level of signals on the path in a predetermined range of phase differences and setting a large gain;
a frequency divider for generating the reference signal having the minimum phase difference with respect to the index signal when the lead-in start signal is input, feedback-inputting the reference signal to the phase comparator, generating the reference signal by dividing the output signal of the controlled oscillator by a predetermined frequency dividing rate N (where N is a positive integer) when an output signal of the controlled oscillator is input, and feedback-inputting the reference signal to the phase comparator;
an unlock detecting circuit for detecting the unlocking of a phase lock based on the index signal and the reference signal or based on the output signal of the phase comparator and for outputting an unlock detecting signal; and a switch unit for shutting up the output signal of the loop filter based on a PLL operational signal and inputting a predetermined signal to the controlled oscillator.

4. A phase locked loop circuit according to claim 1, wherein the controlled oscillator is a voltage controlled oscillator or a current controlled oscillator.

5. A phase locked loop circuit according to claim 2, wherein the frequency divider is a preset frequency divider be preset when the lead-in start signal is input.

* * * * *